(12) United States Patent
Fang et al.

(10) Patent No.: US 12,484,132 B2
(45) Date of Patent: Nov. 25, 2025

(54) DRIVING CIRCUIT AND DRIVING METHOD FOR SWITCHING ELEMENT

(71) Applicant: Silergy Semiconductor Technology (Hangzhou) LTD, Hangzhou (CN)

(72) Inventors: Chiqing Fang, Hangzhou (CN); Zhiwei Xu, Hangzhou (CN); Kailang Hang, Hangzhou (CN); Chen Zhao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 212 days.

(21) Appl. No.: 18/144,933

(22) Filed: May 9, 2023

(65) Prior Publication Data
US 2023/0380039 A1 Nov. 23, 2023

(30) Foreign Application Priority Data

May 23, 2022 (CN) .......................... 202210564599.6

(51) Int. Cl.
*H03K 17/18* (2006.01)
*H03K 17/687* (2006.01)
*H05B 47/14* (2020.01)

(52) U.S. Cl.
CPC ............. *H05B 47/14* (2020.01); *H03K 17/18* (2013.01); *H03K 17/6871* (2013.01)

(58) Field of Classification Search
CPC ...... H03K 17/06; H03K 17/063; H03K 17/08; H03K 17/0817; H03K 17/08116; H03K 17/0812; H03K 17/08128; H03K 17/08148; H03K 17/10; H03K 17/107; H03K 17/12; H03K 17/127; H03K 17/16; H03K 17/168; H03K 17/18; H03K 17/687; H03K 17/6871; H05B 47/14

See application file for complete search history.

(56) References Cited

U.S. PATENT DOCUMENTS

| | | | |
|---|---|---|---|
| 8,581,518 B2 | 11/2013 | Kuang et al. | |
| 9,350,340 B2* | 5/2016 | Ouyang | H03K 17/063 |
| 2011/0127925 A1 | 6/2011 | Huang et al. | |
| 2013/0038316 A1* | 2/2013 | Ouyang | H03K 17/063 |
| | | | 323/311 |
| 2017/0318639 A1 | 11/2017 | Wang et al. | |
| 2018/0295685 A1 | 10/2018 | Wang et al. | |
| 2018/0295690 A1 | 10/2018 | Chen et al. | |
| 2018/0310376 A1 | 10/2018 | Huang et al. | |

FOREIGN PATENT DOCUMENTS

| | | |
|---|---|---|
| CN | 102931961 A | 2/2013 |
| CN | 103728572 A | 4/2014 |

* cited by examiner

*Primary Examiner* — Long Nguyen

(57) ABSTRACT

A method of driving a switching element in a switching circuit, where the switching element comprises a plurality of power transistors coupled in parallel, can include: determining a state of a load in the switching circuit; decreasing a driving voltage of at least one power transistor in order to reduce driving loss of the switching element when a load is in a first load state; and maintaining driving voltages of the plurality of power transistors at a first threshold when the load is in a second load state.

17 Claims, 6 Drawing Sheets

ABSTRACT

DRIVING CIRCUIT AND DRIVING METHOD FOR SWITCHING ELEMENT

RELATED APPLICATIONS

This application claims the benefit of Chinese Patent Application No. 202210564599.6, filed on May 23, 2022, which is incorporated herein by reference in its entirety.

FIELD OF THE INVENTION

The present invention generally relates to the field of power electronics, and more particularly to driving circuits and methods for a switching elements.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Switching circuits are widely used in various products to realize power conversion, and switching elements are an important component of the switching circuit. Two states of the switching element include a conduction state and an off state. When the load of the switching circuit is under a heavy load state, conduction loss and switching loss of the switching element can be relatively high. Therefore, in order to reduce the losses, the switching element can include a plurality of power transistors connected in parallel in many applications, thereby reducing the on-resistance of the switching element. However, the multiple power transistors are connected in parallel, which may lead to an increase of the charge on the gate terminal of the switching element. Thus, when the load in the switching circuit is in a light load state, driving multiple power transistors with the same driving voltage may greatly increase the driving loss, which can greatly reduce system efficiency.

Figure 1:
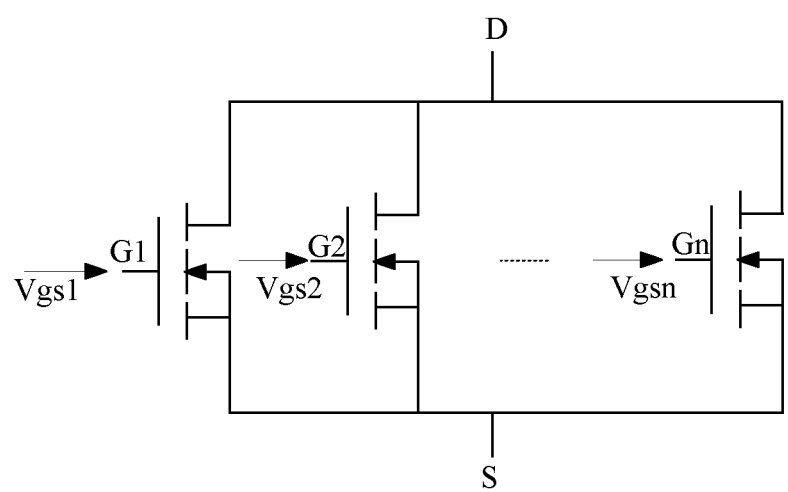
FIG. 1 is a circuit diagram of an example switching element, in accordance with embodiments of the present invention.

Referring now to FIG. 1, shown is a circuit diagram of an example switching element, in accordance with embodiments of the present invention. In this particular example, the switching element can include a plurality of power transistors connected in parallel, where the first power terminal of each power transistor are connected together to form a first power terminal of the switching element, the second power terminal of each power transistor are connected together to form a second power terminal of the switching element, and the control terminal of each power transistor respectively receive a corresponding driving signal. For example, the driving voltages of the driving signals received by the control terminal of each power transistor may be the same or different. Taking the power transistor as an example of MOSFET, hereinafter referred to as MOS transistor, it should be understood that other types of power transistors are also suitable in certain embodiments. In particular embodiments, the first power terminal of the MOS transistor is drain D, the second power terminal of the MOS transistor is source S, and control terminals of the MOS transistor are G1, G2, . . . Gn, respectively, for receiving driving signals Vgs1, Vgs2, . . . Vgsn. Here, driving signals Vgs1-Vgsn may all be the same signal, or there may be at least one driving signal that is different from the others. It should be understood that the switching element is in a conduction state as long as one of the power transistors in the switching element is turned on.

In the first case, the plurality of power transistors in the switching element are divided into a plurality of units, and each unit can include at least one power transistor, where the driving voltage of the power transistors in at least one unit is controlled to decrease under a first load state (e.g., the light load state), and the power transistors in other units are controlled by a fixed driving voltage and do not change with the load state. For example, the plurality of power transistors in the switching element are divided into two units, and each unit can include at least one power transistor, where the driving voltages of the power transistors in the first unit are the same and fixed, and the driving voltages of the power transistors in the second unit are the same and adjustable under the light load state.

In the second case, the plurality of power transistors in the switching element are divided into a plurality of units, and each unit can include at least one power transistor, where the power transistors in each unit are controlled by a corresponding driving voltage, and the driving voltage corresponding to each unit is controlled to decrease under the light load state. For example, the plurality of power transistors in the switching element are divided into two units, and each unit can include at least one power transistor, where the driving voltages of the power transistors in the first unit are the same and adjustable, and the driving voltages of the power transistors in the second unit are the same and adjustable. It should be understood that the driving voltages corresponding to the first and second units can be adjusted to the same value or to different values. In yet another example, the plurality of power transistors in the switching element are divided into a plurality of units, and each unit can include at least one power transistor, where the power transistors in each unit are controlled by a corresponding adjustable driving voltage; that is, the corresponding driving voltage of each unit is independently controlled.

It should be understood that each power transistor can be controlled by an independent driver, and each driver may receive the driving voltage output by the corresponding driving voltage generation circuit to generate a driving signal. In this case, the driving circuit can include the same number of driving modules as the power transistors, and each driving module can include a driver and a driving voltage generation circuit. Of course, it should be understood by those skilled in the art that the driving modules that generate the same driving voltage can be replaced by one driving module; that is, the power transistors receiving the same driving voltage share one driving module. For example, one driving voltage generation circuit can generate the same driving voltage, the same driving voltage may then be provided to one driver, and then the driving signal output by the driver can respectively drive the corresponding power transistors. Alternatively, the power transistors receiving the same driving voltage may share one driving voltage generation circuit, but the number of the drivers can correspond to the number of the power transistors, which can achieve the same function.

In particular embodiments, the driving circuit can include at least one driving module for generating driving signals to drive corresponding power transistors, where when the load of the switching circuit is in the light load state, the driving voltage of the at least one driving signal can be controlled to be decreased to reduce the driving loss of the switching element. In the following, each power transistor may correspond to a driving module as an example.

In particular embodiments, a plurality of power transistors in the switching element are divided into two units, the power transistors in the first unit are controlled by a fixed driving voltage, and the power transistors in the second unit are controlled by an adjustable driving voltage. The driving circuit can include at least one first driving module respectively corresponds to the power transistors in the first unit, and at least one second driving module respectively corresponding to the power transistors in the second unit. Each first driving module can include a first driving voltage generation circuit for generating a fixed first driving voltage, and a driver for receiving the first driving voltage and generating the first driving signal to drive the power transistors in the first unit. Each second driving module can include a second driving voltage generation circuit for generating and adjusting a second driving voltage, and a driver for receiving the second driving voltage and generating a second driving signal to drive the power transistors in the second unit.

Figure 2:
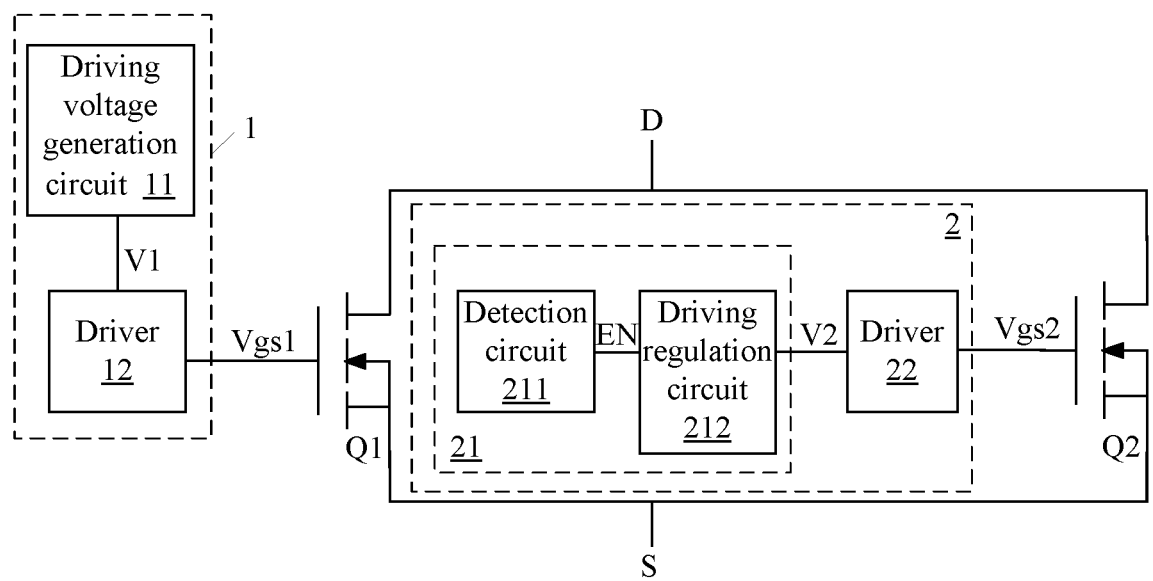
FIG. 2 is a circuit diagram of a first example driving circuit, in accordance with embodiments of the present invention.

Referring now to FIG. 2, shown is a circuit diagram of a first example driving circuit, in accordance with embodiments of the present invention. In particular embodiments, the switching element can include two power transistors connected in parallel as an example. Here, the power transistors are taken as MOS transistors; that is, the first unit can include MOS transistor Q1 and the second unit can include MOS transistor Q2. MOS transistor Q1 can be controlled by driving signal Vgs1 generated by driving module 1. Driving module 1 can include driving voltage generation circuit 11 for generating driving voltage V1, and driver 12 for receiving driving voltage V1 and generating driving signal Vgs1. MOS transistor Q2 can be controlled by driving signal Vgs2 generated by driving module 2. Driving module 2 can include driving voltage generation circuit 21 for generating driving voltage V2, and driver 22 for receiving driving voltage V2 and generating driving signal Vgs2. In particular embodiments, driving voltage V1 is a fixed first threshold; that is, driving voltage generation circuit 11 outputs driving voltage V1 according to a first threshold preset by the system, such that MOS transistor Q1 is in a full conduction state. In some cases, there may be no separate first driving voltage generation circuit, and driving voltage V1 can be generated by other circuits in the system where the switching element is located and can be directly provided to driver 12. The value of driving voltage V2 can be controlled to be adjusted. For example, driving voltage V2 can be adjusted by driving voltage generation circuit 21 according to the load state of the switching circuit where the switching element is located. In addition, driving voltage V2 can be the first threshold under a second load state (e.g., the heavy load state). When the load state of the switching circuit changes from the second load state (e.g., the heavy load state) to a first load state (e.g., the light load state), driving voltage V2 can be controlled to be decreased to reduce the driving loss in the second unit, thereby improving the driving efficiency of the whole switching element.

For example, driving voltage generation circuit 21 can include detection circuit 211 and driving regulation circuit 212. For example, detection circuit 211 can determine the load state and output enable signal EN. When the system is under the heavy load state, enable signal EN can be inactive, and then driving regulation circuit 212 may not adjust driving voltage V2, such that driving voltage V2 is maintained at the first threshold (e.g., remains unchanged). When the system is under the light load state, enable signal EN can be active, such that driving regulation circuit 212 starts to decrease driving voltage V2.

In some embodiments, detection circuit 211 can detect the voltage (e.g., the drain-source voltage) between power terminals D and S of the switching element when the switching element is turned on, in order to determine the state of the load. When a voltage sampling signal representing the voltage between power terminals D and S is less than a reference signal, this may indicate that the system is in the light load state. Otherwise, the system can be determined as being in the heavy load state. In other examples, detection circuit 211 can determine the state of the load through external signals. For example, for a circuit system, if there is a signal in another circuit to determine whether the load is under the light load state or the heavy load state, this can be directly sent to detection circuit 211 without detecting the drain-source voltage of the switching element.

It should be understood that the circuit system can further include a control circuit that generates switching logic signal pulse-width modulation (PWM) to indicate the on-off state of the switching element, such that each driver receives switching logic signal PWM, outputs the received driving voltage when switching logic signal PWM is active, and pulls down control terminal G (e.g., the gate) of the power transistor to zero when switching logic signal PWM is inactive, thus forming the final driving signal. In addition, those skilled in the art will recognize that the driving loss is related to switching frequency f, gate charge Qg, and the driving voltage of each MOS transistor. In particular embodiments, the expression of driving loss Pd can be as follows:

$$Pd = f \times Qg1 \times V1 + f \times Qg2 \times V2$$

Here, Qg1 is the gate charge of MOS transistor Q1 and Qg2 is the gate charge of MOS transistor Q2. Therefore, when driving voltage V2 decreases, driving loss Pd also decreases.

For example, driving regulation circuit 212 have multiple ways to adjust driving voltage V2. In some embodiments, driving voltage V2 can be controlled under an open loop.

For example, when enable signal EN is active, driving regulation circuit 212 can decrease driving voltage V2 to a second threshold to reduce driving loss. In one example, driving regulation circuit 212 can gradually decrease driving voltage V2 to the second threshold. In another example, driving regulation circuit 212 can directly decrease driving voltage V2 to the second threshold. In other embodiments, driving voltage V2 can be controlled under a closed loop. For example, when enable signal EN is active, driving regulation circuit 212 can receive voltage sampling signal Vds, and stabilize voltage sampling signal Vds at a third threshold by adjusting driving voltage V2, and then maintain and output the current driving voltage V2, where the third threshold is greater than voltage sampling signal Vds before adjustment. It should be understood that both the second and third thresholds can be set according to the system requirements. Because decreasing the driving voltage may increase the on-resistance and the conduction loss of the power transistor, it may be necessary to set different thresholds for the driving voltage in different cases, such that the conduction loss and the driving loss can be considered comprehensively to achieve the best power consumption balance and reduce the loss of the entire switching element.

Figure 3:
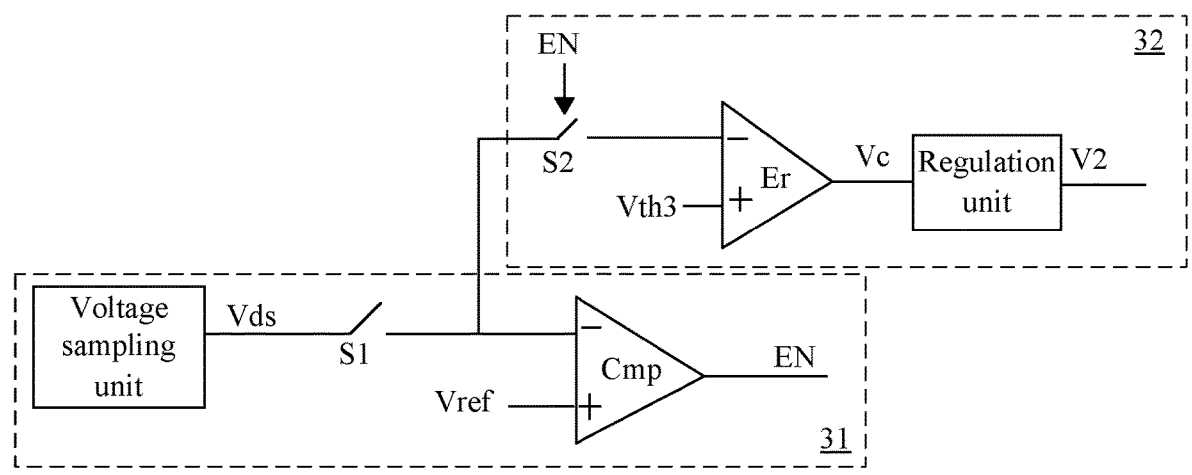
FIG. 3 is a circuit diagram of a second driving voltage generation circuit in the driving circuit, in accordance with embodiments of the present invention.

Referring now to FIG. 3, shown is a circuit diagram of a second driving voltage generation circuit in the driving circuit, in accordance with embodiments of the present invention. In this particular example, detection circuit 31 can include a voltage sampling unit for sampling the voltage between drain D and source S to generate voltage sampling signal Vds, and comparator Cmp for comparing voltage sampling signal Vds against reference signal Vref during the effective period of switching logic signal PWM. For example, a non-inverting input terminal of comparator Cmp can receive reference signal Vref, and an inverting input terminal of comparator Cmp can connect to switch S1 to receive voltage sampling signal Vds during the conduction period of switch S1. Switch S1 can be controlled by switching logic signal PWM and may be turned on when switching logic signal PWM is active, such that voltage sampling signal Vds is received and compared during the conduction period of the switching element. When voltage sampling signal Vds is less than reference signal Vref, enable signal EN output by comparator Cmp can be active, indicating that the load is in the light load state at this time.

Driving regulation circuit 32 can generate error signal Vc to adjust driving voltage V2 according to the error between voltage sampling signal Vds and threshold Vth3 when the load is in the light load state, until voltage sampling signal Vds is equal to threshold Vth3, and output driving voltage V2 at this time. For example, driving regulation circuit 32 can include error amplifier Er and a regulation unit, whereby a non-inverting input terminal of error amplifier Er receives threshold value Vth3, and an inverting input terminal of error amplifier Er can connect to switch S2 to receive voltage sampling signal Vds when switch S2 is turned on. Switch S2 can be controlled by enable signal EN and turned on when enable signal EN is active; that is, when the load is in the light load state. When voltage sampling signal Vds is less than threshold value Vth3, error signal Vc can increase, and the regulation unit may decrease driving voltage V2, while the on-resistance of the power transistor increases with the decrease of the driving voltage, such that voltage sampling signal Vds increases. This process can continue until voltage sampling signal Vds is equal to threshold Vth3. In the regulation process, driving voltage V2 can be decreased by a predetermined step. It should be understood that when error signal Vc decreases during the regulation process, this can indicate that voltage sampling signal Vds is greater than threshold Vth3, and driving voltage V2 may be increased accordingly, such that voltage sampling signal Vds is maintained at threshold Vth3. As described above, the best power consumption balance can be met by setting threshold Vth3 according to system requirements.

It should be understood that the above example only gives one specific implementation of the second driving voltage generation circuit, and those skilled in the art will recognize that there are many alternatives for each circuit unit or module, so other circuits that can adjust the second driving voltage according to the drain-source voltage can alternatively be utilized in certain embodiments. In addition, since driving voltage V1 generated by at least one first driving module in the first unit may all be the same, the power transistors in the first unit can share one first driving module in some examples, and similarly, the second driving voltages generated by the at least one second driving module in the second unit can be the same, such that the power transistors in the second unit can share one second driving module in some embodiments.

Figure 4:
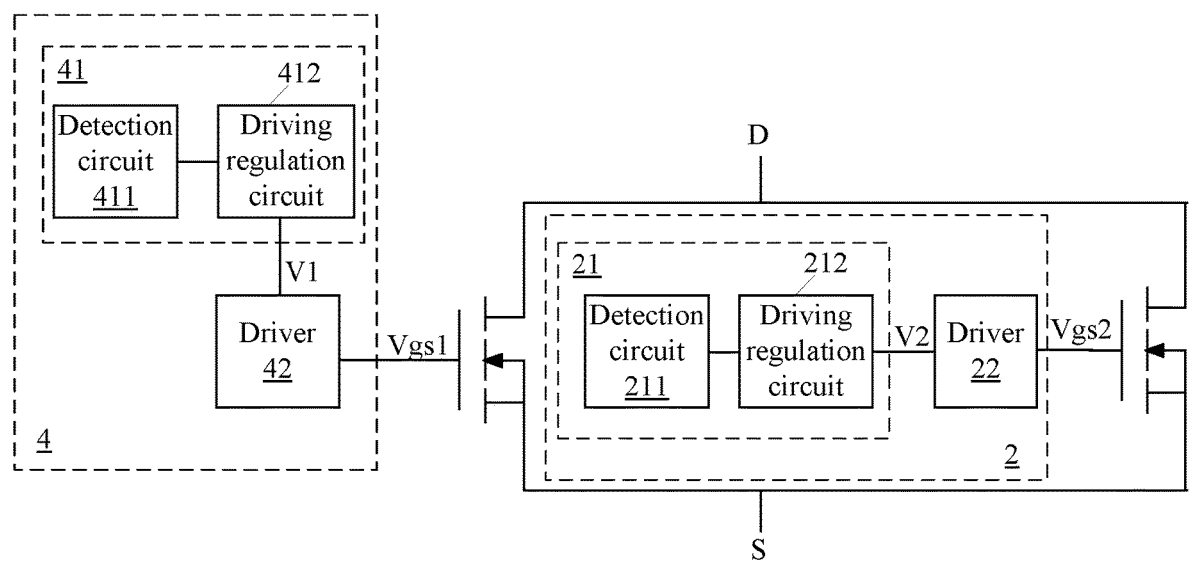
FIG. 4 is a circuit diagram of a second example driving circuit, in accordance with embodiments of the present invention.

Referring now to FIG. 4, shown is a circuit diagram of a second example driving circuit, in accordance with embodiments of the present invention. Similarly, a plurality of power transistors of the switching element are divided into two units. Different from the first example driving circuit, the driving voltages of the power transistors in the first unit are also adjustable in this example. Therefore, driving module 4 corresponding to the first unit in the driving circuit can include driving voltage generation circuit 41 for generating and adjusting driving voltage V1. Similarly, driving voltage generation circuit 41 can include detection circuit 411 and driving regulation circuit 412, and the generating and adjusting the driving voltage may be the same as that of the second driving voltage generation circuit in the above-mentioned example. In this particular example, driving voltages V1 and V2 can be adjusted to different values or the same value.

It should be understood that In particular embodiments, the power transistors in the switching element can be divided into more units, and each unit can include at least one power transistor. Therefore, the driving circuit can include a plurality of driving modules corresponding to a plurality of units one by one, and the power transistor in each unit is controlled by the adjustable driving voltage. The structure and function of each driving module may be the same as the second driving module in FIG. 2, and the driving voltages corresponding to the driving signals output by each driving module can be the first threshold under the heavy load state, and may be adjusted to the same or different values under the light load state.

Figure 5:
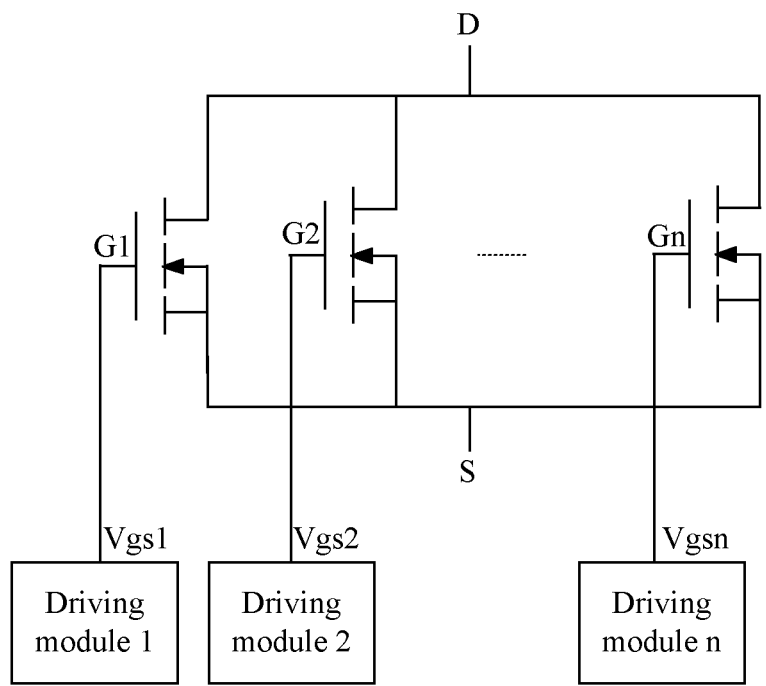
FIG. 5 is a circuit diagram of a third example driving circuit, in accordance with embodiments of the present invention.

Referring now to FIG. 5, shown is a circuit diagram of a third example driving circuit, in accordance with embodiments of the present invention. In this particular example, the switching element can include n power transistors, and each power transistor is taken as a unit, that is, the power transistors in the switching element are divided into n units, and each unit can include one power transistor. The driving circuit can include n driving modules (e.g., driving modules 1-$n$) for generating driving signals Vgs1-Vgsn to drive power transistors Q1-Qn, respectively. Each driving module can include a driving voltage generation circuit and a driver, and each driving voltage generation circuit independently adjusts the desired driving voltage of the controlled power transistor. The circuit structure and driving method of the specific driving module may be the same as those of the second driving module in the first example driving circuit. In addition, during the adjustment process of each driving module, the driving voltage generated by each driving module can be adjusted to different values, or to the same value.

Figure 6:
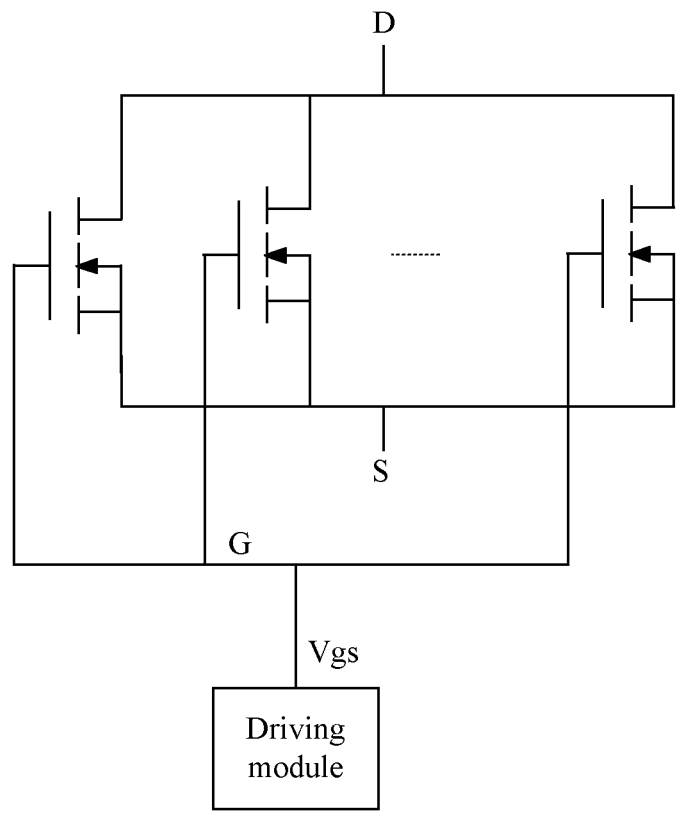
FIG. 6 is a circuit diagram of a fourth example driving circuit, in accordance with embodiments of the present invention.

It should be understood that when the driving voltages of the n power transistors in FIG. 5 are all adjusted to the same value, only one driving module; that is, only one second driving voltage generation circuit and one driver, can be used to realize the driving control of the n power transistors in the switching element, as shown in FIG. 6, which is a circuit diagram of a fourth example driving circuit, in accordance with embodiments of the present invention. Similarly, the structure, function and adjustment method of the second driving voltage generation circuit can be the same as the above-mentioned example. However, in this particular example control terminals G of each power transistor can connect together and receive driving signal Vgs generated by the same driver. In this way, the number of driving modules may be reduced, and the volume and cost of the circuit reduced, which is beneficial to system integration.

Particular embodiments may also provide a driving method for driving the switching element in the switching circuit, which can include determining the state of the load in the switching circuit, decreasing the driving voltage of at least one power transistor to reduce the driving loss of the switching element in response to the load being in a first load state (e.g., the light load state), and maintaining the driving voltages of a plurality of power transistors at a first threshold in response to the load being in a second load state (e.g., the heavy load state).

For example, the decreasing the driving voltage of at least one power transistor to reduce the driving loss of the switching element can include decreasing driving voltages of a part of power transistors and maintaining driving voltages of the other part of power transistors at the first threshold, in response to the load being in the first load state, or decreasing driving voltages of each of the plurality of power transistors in response to the load being in the first load state.

For example, when the switching element is in the conduction state, the state of the load can be determined according to the voltage between the first power terminal and the second power terminal of the switching element. For example, the method of decreasing the driving voltage of the power transistor can be decreasing the driving voltage of the at least one power transistor from the first threshold to a second threshold in response to the load being in the first load state.

For example, the method of reducing the driving voltage of the power transistor may also be decreasing the driving voltage of the corresponding power transistor according to a voltage between a first power terminal and a second power terminal of the switching element, in response to the load being in the first load state. For example, when the voltage sampling signal representing the voltage between the first power terminal and the second power terminal of the switching element is less than the third threshold, the driving voltage of the corresponding power transistor can be decreased such that the voltage sampling signal is equal to the third threshold.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of driving a switching element in a switching circuit, wherein the switching element comprises a plurality of power transistors coupled in parallel, the method comprising:
    a) determining a state of a load in the switching circuit;
    b) decreasing a driving voltage of at least one power transistor according to a voltage between a first power terminal and a second power terminal of the switching element in order to reduce driving loss of the switching element when the load is in a first load state; and
    c) maintaining driving voltages of the plurality of power transistors at a first threshold when the load is in a second load state.

2. The method of claim 1, further comprising decreasing driving voltages of a first group of the plurality of power transistors, and maintaining driving voltages of a second group of the plurality of power transistors at the first threshold, in response to the load being in the first load state.

3. The method of claim 1, further comprising decreasing the driving voltage of each of the plurality of power transistors in response to the load being in the first load state.

4. The method of claim 1, further comprising determining a state of the load according to the voltage between the first power terminal and the second power terminal of the switching element, when the switching element is in a conduction state.

5. The method of claim 1, wherein the decreasing the driving voltage of the power transistor comprises decreasing the driving voltage from the first threshold to a second threshold in response to the load being in the first load state.

6. The method of claim 1, further comprising decreasing the driving voltage of the at least one power transistor such that a voltage sampling signal is equal to a third threshold, when the voltage sampling signal representing the voltage between the first power terminal and the second power terminal of the switching element is less than the third threshold.

7. A driving circuit configured to drive a switching element in a switching circuit, wherein the switching element comprises a plurality of power transistors coupled in parallel, the driving circuit comprising:
    a) at least one driving module configured to generate a plurality of driving signals to respectively drive the plurality of power transistors, wherein each of the at least one driving module comprises a driver configured to receive a driving voltage, and a switching logic signal configured to generate a respective driving signal of the plurality of driving signals; and
    b) wherein when a load in the switching circuit is in a first load state, the driving voltage of at least one driving signal of the plurality of driving signals is controlled to be decreased, in order to reduce driving loss of the switching element.

8. The driving circuit of claim 7, wherein when the plurality of power transistors in the switching element are divided into a plurality of units, and each unit comprises at least one of the plurality of power transistors, the driving voltage of the power transistor in at least one unit is controlled to be decreased, and the power transistors in remaining units are controlled by fixed driving voltages when the load is in the first load state.

9. The driving circuit of claim 7, wherein when the plurality of power transistors in the switching element are divided into a plurality of units, and each unit comprises at least one power transistor, the power transistor in each unit is controlled by a corresponding driving voltage, and the corresponding driving voltage of each unit is controlled to be reduced when the load is in the first load state.

10. The driving circuit of claim 8, wherein the driving module corresponding to the power transistor controlled by the fixed driving voltage comprises a first driving voltage generation circuit configured to generate a first threshold as the driving voltage.

11. The driving circuit of claim 9, wherein the driving module corresponding to the power transistor with the driving voltage being decreased comprises a second driving voltage generation circuit, wherein the second driving voltage generation circuit comprises:
   a) a detection circuit configured to determine the state of the load; and
   b) a driving regulation circuit configured to decrease the driving voltage when the load is in the first load state and maintain the driving voltage at the first threshold when the load is in a second load state.

12. The driving circuit of claim 11, wherein the detection circuit is configured to determine the state of the load according to a voltage between a first power terminal and a second power terminal of the switching element when the switching element is in a conduction state.

13. The driving circuit of claim 12, wherein:
   a) the detection circuit determines that the load is in the first load state when a voltage sampling signal that represents the voltage between the first power terminal and the second power terminal of the switching element is less than a reference signal; and
   b) the detection circuit determines that the load is in the second load state when the voltage sampling signal is greater than the reference signal.

14. The driving circuit of claim 11, wherein the driving regulation circuit is configured to decrease the driving voltage from the first threshold to a second threshold when the load is in the first load state.

15. The driving circuit of claim 11, wherein the driving regulation circuit is configured to adjust the driving voltage according to a voltage between first and second power terminals of the switching element, until a voltage sampling signal that represents the voltage between the first and second power terminals is maintained at a third threshold when the load is in the first load state.

16. The driving circuit of claim 15, wherein the driving regulation circuit comprises:
   a) an error amplifier configured to obtain an error signal representing a difference between the voltage sampling signal and the third threshold when the load is in the first load state; and
   b) a regulation unit configured to decrease the driving voltage when the error signal increases, and to increase the driving voltage when the error signal decreases, such that the voltage sampling signal is maintained at the third threshold.

17. The driving circuit of claim 7, wherein the at least one driving module generating a same driving voltage are configured as a single driving module.

* * * * *